United States Patent
Lin et al.

(10) Patent No.: US 11,095,093 B2
(45) Date of Patent: Aug. 17, 2021

(54) LASER DRIVER WITH HIGH-SPEED AND HIGH-CURRENT AND CURRENT MODULATING METHOD THEREOF

(71) Applicants: ANHUI TRANSILICA MICROELECTRONICS CO., LTD., Hefei (CN); JIANGSU KEDA HENGXIN SEMICON TECH CO., LTD., Suzhou (CN)

(72) Inventors: Fujiang Lin, Singapore (SG); Ahmed Wahba Abdalla Elsayed, Zagazig (EG); Xi Li, Hefei (CN)

(73) Assignees: ANHUI TRANSILICA MICROELECTRONICS CO., LTD., Hefei (CN); JIANGSU KEDA HENGXIN SEMICON TECH CO., LTD., Suzhou (CN)

( * ) Notice: Subject to any disclaimer, the term of this patent is extended or adjusted under 35 U.S.C. 154(b) by 0 days.

(21) Appl. No.: 16/740,468

(22) Filed: Jan. 12, 2020

(65) Prior Publication Data
US 2020/0251883 A1 Aug. 6, 2020

(30) Foreign Application Priority Data
Feb. 1, 2019 (CN) .......................... 201910102739.6

(51) Int. Cl.
*H01S 5/042* (2006.01)
(52) U.S. Cl.
CPC .......... *H01S 5/0427* (2013.01); *H01S 5/0428* (2013.01)

(58) Field of Classification Search
CPC ...................................................... H05B 45/33
See application file for complete search history.

(56) References Cited

U.S. PATENT DOCUMENTS

| | | | |
|---|---|---|---|
| 6,618,406 B1* | 9/2003 | Kaminishi | H01S 5/042 372/38.02 |
| 6,700,909 B2* | 3/2004 | Tsai | H01S 5/042 372/38.01 |
| 8,854,928 B1* | 10/2014 | Kuehlwein | G11B 5/02 369/13.17 |
| 2002/0094000 A1* | 7/2002 | Heilman | H01S 5/042 372/38.02 |

* cited by examiner

*Primary Examiner* — Tod T Van Roy
(74) *Attorney, Agent, or Firm* — Hemisphere Law, PLLC; Zhigang Ma (57) ABSTRACT

A laser driver with high-speed and high-current and current modulating method thereof is invented. The laser driver includes a first driving unit and a second driving unit, each driving unit including a pre-drive amplifier circuit and a main drive amplifier circuit. The pre-drive amplifier circuit includes a first differential transistor pair circuit, a differential voltage conversion circuit, a DC common mode level reduction circuit and a first cascode current mirror circuit. The main drive amplifier circuit includes a second differential transistor pair circuit, a bandwidth boost circuit, a matching circuit and a second cascode current mirror circuit. The present invention avoids the enhancement of chip area caused by the use of passive inductors peaking mode to enhance bandwidth, and reduces the cost of chip, design complexity and circuit power consumption.

12 Claims, 2 Drawing Sheets

LASER DRIVER WITH HIGH-SPEED AND HIGH-CURRENT AND CURRENT MODULATING METHOD THEREOF

FIELD OF THE INVENTION

The present invention relates to an optoelectronic integrated circuit (OEIC), and more particularly to a laser driver with high-speed and high-current and current modulating method thereof.

BACKGROUND OF THE INVENTION

With the speedy development of communication networks, more and more communication networks need optical fiber communication networks with high bandwidth and low loss. A laser driver is a key circuit of an optoelectronic integrated circuit in a fiber communication system. It's important for outputting quality optical signals with the laser driver has high bandwidth and the modulated current intensity. In order to work with high-speed without inter-symbol interference (ISI), the laser driver needs sufficient bandwidth. In order to get enough modulated current to ensure outputting big extinction ratio, the laser driver must also be with proper gain.

In order to output high current, pins of the laser driver are in bigger sizes, or input signals of the laser driver have higher amplitude. However, the amplitude of the input signals always has been limited, and work speed of the laser driver will be limited by high input capacitance because the bigger the sizes of pins are, the bigger input capacitance will be.

Currently, the laser driver with high-current uses passive inductors peaking mode or active negative feedback mode to improve circuit bandwidth. However, by using the passive inductors peaking mode, both the expenditure of chip area and the production costs will be increased significantly. Using the active negative feedback mode will not only has high cost, but also cause stabilization problems. As the traditional high-current laser driver usually uses cascading of two-stage amplifiers, it has a problem of the common mode voltage.

SUMMARY OF THE INVENTION

Therefore, the object of the present invention is to provide a laser driver with high-speed and high-current to solve the problem of lack of bandwidth.

The laser driver with high-speed and high-current receives high-speed differential data signals, and outputs differential drive voltage signal after processing the differential data signals by negative capacitance technique, so as to improve the bandwidth of the laser driver.

Another object of the present invention is to provide a current modulation method about a laser driver with high-speed and high-current to obtain a modulation current for the laser driver.

The present invention provides a laser driver with high-speed and high-current, receiving a pair of high-speed differential data signals $V_{in1}$, $V_{in2}$, and outputting a differential drive voltage signal $V_O$; the laser driver includes a first driving unit and a second driving unit; each driving unit includes a pre-drive amplifier circuit and a main drive amplifier circuit;

the pre-drive amplifier circuit includes:
a NMOSFET $M_{1A}$;
a NMOSFET $M_{1B}$;
a resistor $R_{p1}$, one end of the resistor $R_{p1}$ is electrically connected to the drain of the NMOSFET $M_{1A}$;
a resistor $R_{p2}$, one end of the resistor $R_{p2}$ is electrically connected to the drain of the NMOSFET $M_{1B}$;
a resistor $R_{s1}$, one end of the resistor $R_{s1}$ is electrically connected to the other ends of the resistors $R_{p1}$ and $R_{p2}$, the other end of the resistor $R_{s1}$ is electrically connected to the ground;
a NMOSFET $M_5$, with the gate and the drain of the NMOSFET $M_5$ being electrically connected, and receiving a current $I_{B1}$;
a NMOSFET $M_6$, the gate and the drain of the NMOSFET $M_6$ being electrically connected, and are electrically connected to the source of the NMOSFET $M_5$; the source of the NMOSFET $M_6$ receiving a voltage $V_{SS}$;
a NMOSFET $M_7$, with the gates of the NMOSFETs $M_7$ and $M_5$ being electrically connected, the drain of the NMOSFET $M_7$ is electrically connected to the sources of the NMOSFETs $M_{1A}$ and $M_{1B}$; and
a NMOSFET $M_8$, with the gates of the NMOSFETs $M_8$ and $M_6$ being electrically connected, the drain of the NMOSFET $M_8$ electrically connected to the source of the NMOSFET $M_7$, the source of the NMOSFET $M_8$ receiving the voltage $V_{SS}$;

the main drive amplifier circuit includes:
a NMOSFET $M_{2A}$, the gate of the NMOSFET $M_{2A}$ is electrically connected to the drain of the NMOSFET $M_{1B}$;
a NMOSFET $M_{2B}$, the gate of the NMOSFET $M_{2B}$ is electrically connected to the drain of the NMOSFET $M_{1A}$;
a resistor $R_1$, one end of the resistor $R_1$ is electrically connected to the drain of the NMOSFET $M_{2A}$, the other end of the resistor $R_1$ is electrically connected to the ground;
a resistor $R_2$, one end of the resistor $R_2$ is electrically connected to the drain of the NMOSFET $M_{2B}$, the other end of the resistor $R_2$ is electrically connected to the ground;
a capacitor $C_{F1}$, one end of the capacitor $C_{F1}$ is electrically connected to the gate of the NMOSFET $M_{2A}$, the other end of the capacitor $C_{F1}$ is electrically connected to the drain of the NMOSFET $M_{2B}$;
a capacitor $C_{F2}$, one end of the capacitor $C_{F2}$ is electrically connected to the gate of the NMOSFET $M_{2B}$, the other end of the capacitor $C_{F2}$ is electrically connected to the drain of the NMOSFET $M_{2A}$;
a NMOSFET $M_9$, with the gate and the drain of the NMOSFET $M_9$ being electrically connected, and receiving a current $I_{B2}$;
a NMOSFET $M_{10}$, with the gate and the drain of the NMOSFET $M_{10}$ being electrically connected, and electrically connected to the source of the NMOSFET $M_9$; the source of the NMOSFET $M_{10}$ receiving the voltage $V_{SS}$;
a NMOSFET $M_{11}$, the gates of the NMOSFETs $M_{11}$ and $M_9$ being electrically connected, the drain of the NMOSFET $M_{11}$ electrically connected to the sources of the NMOSFETs $M_{2A}$ and $M_{2B}$; and
a NMOSFET $M_{12}$, with the gates of the NMOSFETs $M_{12}$ and $M_{10}$ being electrically connected, the drain of the NMOSFET $M_{12}$ electrically connected to the source of the NMOSFET $M_{11}$, the source of the NMOSFET $M_{12}$ receiving the voltage $V_{SS}$.

The gates of the NMOSFETs $M_{1A}$ and $M_{1B}$ of the first driving unit are used for receiving the signals $V_{in1}$, the gates of the NMOSFETs $M_{1A}$ and $M_{1B}$ of the second driving unit are used for receiving the signals $V_{in2}$; the drain of the NMOSFET $M_{2A}$ of the first driving unit is electrically connected to the drain of the NMOSFET $M_{2A}$ of the second driving unit, and the drain of the NMOSFET $M_{2B}$ of the first driving unit is electrically connected to the drain of the NMOSFET $M_{2B}$ of the second driving unit, two connection ends are connected to the connection of the NMOSFET $M_{2A}$ of the first driving unit and the second driving unit and the connection of the NMOSFET $M_{2B}$ of the first driving unit and the second driving unit, respectively, the two connection ends serves as the outputs of the signal $V_O$.

In the laser driver of the present invention, the resistance values of the resistors $R_1$ and $R_2$ are equal to 100Ω.

In the laser driver of the present invention, the capacitance value of the capacitor $C_{F1}$ is equal to the capacitance value of the capacitor $C_{F2}$.

In the laser driver of the present invention, the size of the NMOSFET of the second driving unit is smaller than the size of the NMOSFET of the first driving unit.

In the laser driver of the present invention, when the current $I_{B1}$ or $I_{B2}$ are valid, the two connection ends are electrically connected with an external resistor, the signal $V_O$ is directly modulated by the typical input impedance of the laser.

The present invention also provides a laser driver with high-speed and high-current, receiving a pair of high-speed differential data signals $V_{in1}$, $V_{in2}$, and outputting a differential drive voltage signal $V_O$; the laser driver includes a first driving unit and a second driving unit; each driving unit includes a pre-drive amplifier circuit and a main drive amplifier circuit;

the pre-drive amplifier circuit includes:
a first differential transistor pair circuit, being used for converting one high-speed differential data signal into a first differential current signal;
a differential voltage conversion circuit, being used for converting the first differential current signal into a first differential voltage signal;
a DC common mode level reduction circuit, being used for reducing the DC common mode level of the first differential voltage signal, then transmitting the reduced differential voltage signal to the main drive amplifier circuit; and
a first cascode current mirror circuit, being used for providing an output modulation current for the first differential transistor pair circuit;

the main drive amplifier circuit includes:
a second differential transistor pair circuit, being used for converting the first differential voltage signal into a second differential current signal;
a bandwidth boost circuit, being used for improving the bandwidth of the second differential transistor pair circuit;
a matching circuit, being used for binding the ringing caused by the line inductance and to complete the impedance matching of the laser driver; and
a second cascode current mirror circuit, being used for providing a modulation current for the second differential transistor pair circuit.

In the laser driver of the present invention, the first differential transistor pair circuit includes NMOSFETs $M_{1A}$ and $M_{1B}$; the gates of the NMOSFETs $M_{1A}$ and $M_{1B}$ of the first driving unit being used for receiving the signals $V_{in1}$, the gates of the NMOSFETs $M_{1A}$ and $M_{1B}$ of the second driving unit being used for receiving the signals $V_{in2}$; the drains of the NMOSFETs $M_{1A}$ and $M_{1B}$ are electrically connected to the differential voltage conversion circuit.

In the laser driver of the present invention, the differential voltage conversion circuit includes resistors $R_{p1}$ and $R_{p2}$, the DC common mode level reduction circuit includes a resistor $R_{s1}$; one end of the resistor $R_{p1}$ electrically connecting the drain of the NMOSFET $M_{1A}$, one end of the resistor $R_{p2}$ is electrically connected to the drain of the NMOSFET $M_{1B}$; one end of the resistor $R_{s1}$ electrically connecting the other ends of the resistors $R_{p1}$ and $R_{p2}$, the other end of the resistor $R_{s1}$ electrically connecting ground.

In the laser driver of the present invention, the first cascode current mirror circuit includes NMOSFETs $M_5$, $M_6$, $M_7$ and $M_8$; the gate and the drain of the NMOSFET $M_5$ are electrically connected, and receiving a current Isi; the gate and the drain of the NMOSFET $M_6$ are electrically connected, and electrically connected to the source of the NMOSFET $M_5$; the source of the NMOSFET $M_6$ receiving a voltage $V_{SS}$; the gates of the NMOSFETs $M_7$ and $M_5$ are electrically connected, the drain of the NMOSFET $M_7$ electrically connected to the sources of the NMOSFETs $M_{1A}$ and $M_{1B}$; the gates of the NMOSFETs $M_8$ and $M_6$ are electrically connected, the drain of the NMOSFET $M_8$ is electrically connected to the source of the NMOSFET $M_7$, the source of the NMOSFET $M_8$ receiving the voltage $V_{SS}$.

In the laser driver of the present invention, the second differential transistor pair circuit includes NMOSFETs $M_{2A}$ and $M_{2B}$; the gate of the NMOSFET $M_{2A}$ is electrically connected to the drain of the NMOSFET $M_{1B}$, the gate of the NMOSFET $M_{2B}$ is electrically connected to the drain of the NMOSFET $M_{1A}$; the drains of the NMOSFETs $M_{2A}$ and $M_{2B}$ are electrically connected to the matching circuit.

In the laser driver of the present invention, wherein the bandwidth boost circuit includes capacitors $C_{F1}$ and $C_{F2}$; one end of the capacitor $C_{F1}$ is electrically connected to the gate of the NMOSFET $M_{2A}$, the other end of the capacitor $C_{F1}$ is electrically connected to the drain of the NMOSFET $M_{2B}$; one end of the capacitor $C_{F2}$ is electrically connected to the gate of the NMOSFET $M_{2B}$, the other end of the capacitor $C_{F2}$ is electrically connected to the drain of the NMOSFET $M_{2A}$.

In the laser driver of the present invention, the matching circuit includes resistors $R_1$ and $R_2$; one end of the resistor $R_1$ is electrically connected to the drain of the NMOSFET $M_{2A}$, the other end of the resistor $R_1$ is electrically connected to the ground; one end of the resistor $R_2$ is electrically connected to the drain of the NMOSFET $M_{2B}$, the other end of the resistor $R_2$ is electrically connected to the ground.

In the laser driver of the present invention, the drain of the NMOSFET $M_{2A}$ of the first driving unit is electrically connected to the drain of the NMOSFET $M_{2A}$ of the second driving unit, and the drain of the NMOSFET $M_{2B}$ of the first driving unit is electrically connected to the drain of the NMOSFET $M_{2B}$ of the second driving unit, two connection ends are connected to the connection of the NMOSFET $M_{2A}$ of the first driving unit and the second driving unit and the connection of the NMOSFET $M_{2B}$ of the first driving unit and the second driving unit, respectively, the two connection ends serves as the outputs of the signal $V_O$.

In the laser driver of the present invention, the second cascode current mirror circuit includes NMOSFETs $M_9$, $M_{10}$, $M_{11}$ and $M_{12}$; the gate and the drain of the NMOSFET $M_9$ are electrically connected, and receiving a current $I_{B2}$; the gate and the drain of the NMOSFET $M_{10}$ are electrically connected, and electrically connected to the source of the NMOSFET $M_9$; the source of the NMOSFET $M_{10}$ is receiving the voltage $V_{SS}$; the gates of the NMOSFETs $M_{11}$ and $M_9$ are electrically connected, the drain of the NMOSFET $M_{11}$ is electrically connected to the sources of the NMOS- FETs $M_{2A}$ and $M_{2B}$; the gates of the NMOSFETs $M_{12}$ and $M_{10}$ are electrically connected, the drain of the NMOSFET $M_{12}$ is electrically connected to the source of the NMOSFET $M_{11}$, the source of the NMOSFET $M_{12}$ receiving the voltage $V_{SS}$.

In the laser driver of the present invention, when the current $I_{B1}$ or $I_{B2}$ are valid, the two connection ends are electrically connected with an external resistor, the signal $V_0$ is directly modulated by the typical input impedance of the laser.

In the laser driver of the present invention, when both the currents $I_{B1}$ and $I_{B2}$ are valid, the signal $V_0$ is directly modulated by a four-level Pulse Amplitude Modulated mode.

The present invention also provides a current modulation method about a laser driver with high-speed and high-current; the laser driver is used for receiving a pair of high-speed differential data signals $V_{in1}$, $V_{in2}$, and outputting a differential drive voltage signal $V_0$; the laser driver includes a first driving unit and a second driving unit; each driving unit includes a pre-drive amplifier circuit and a main drive amplifier circuit;

the pre-drive amplifier circuit includes:
a first differential transistor pair circuit, being used for converting one high-speed differential data signal into a first differential current signal;
a differential voltage conversion circuit, being used for converting the first differential current signal into a first differential voltage signal;
a DC common mode level reduction circuit, being used for reducing the DC common mode level of the first differential voltage signal, then transmitting the reduced differential voltage signal to the main drive amplifier circuit; and
a first cascode current mirror circuit, being used for providing an output modulation current for the first differential transistor pair circuit;

the main drive amplifier circuit includes:
a second differential transistor pair circuit, being used for converting the first differential voltage signal into a second differential current signal;
a bandwidth boost circuit, being used for improving the bandwidth of the second differential transistor pair circuit;
a matching circuit, being used for binding the ringing caused by the line inductance and to complete the impedance matching of the laser driver; and
a second cascode current mirror circuit, being used for providing a modulation current for the second differential transistor pair circuit.

the current modulation method includes:
judging whether the currents $I_{B1}$ and $I_{B2}$ being valid;
when the current $I_{B1}$ or $I_{B2}$ is valid, electrically connecting the two connection ends with an external resistor, and modulating the signal $V_0$ directly by the typical input impedance of the laser; and
when both the currents $I_{B1}$ and $I_{B2}$ are valid, modulating the signal $V_0$ directly by a four-level Pulse Amplitude Modulated mode.

In the current modulation method of the present invention, when the resistance value of the external resistor being equal to 25Ω, the first driving unit is able to provide a maximum modulation current of 80 mA, the second driving unit is able to provide a maximum modulation current of 40 mA; when the resistance value of the external resistor is equal to 50Ω, the first driving unit is able to provide a maximum modulation current of 60 mA, the second driving unit is able to provide a maximum modulation current of 30 mA.

In the current modulation method of the present invention, when both the currents $I_{B1}$ and $I_{B2}$ are valid, the two driving units is able to provide a maximum modulation current of 120 mA.

In the current modulation method of the present invention, the first differential transistor pair circuit includes NMOSFETs $M_{1A}$ and $M_{1B}$; the gates of the NMOSFETs $M_{1A}$ and $M_{1B}$ of the first driving unit are used for receiving the signals $V_{in1}$, the gates of the NMOSFETs $M_{1A}$ and $M_{1B}$ of the second driving unit are used for receiving the signals $V_{in2}$; the differential voltage conversion circuit includes resistors $R_{p1}$ and $R_{p2}$, the DC common mode level reduction circuit includes a resistor $R_{s1}$; one end of the resistor $R_{p1}$ is electrically connected to the drain of the NMOSFET $M_{1A}$, one end of the resistor $R_{p2}$ is electrically connected to the drain of the NMOSFET $M_{1B}$; one end of the resistor $R_{s1}$ is electrically connected to the other ends of the resistors $R_{p1}$ and $R_{p2}$, the other end of the resistor $R_{s1}$ is electrically connected to the ground; the first cascode current mirror circuit includes NMOSFETs $M_5$, $M_6$, $M_7$ and $M_8$; the gate and the drain of the NMOSFET $M_5$ are electrically connected, and receiving a current Isi; the gate and the drain of the NMOSFET $M_6$ are electrically connected, and electrically connected to the source of the NMOSFET $M_5$; the source of the NMOSFET $M_6$ is receiving a voltage $V_{SS}$; the gates of the NMOSFETs $M_7$ and $M_5$ are electrically connected, the drain of the NMOSFET $M_7$ is electrically connected to the sources of the NMOSFETs $M_{1A}$ and $M_{1B}$; the gates of the NMOSFETs $M_8$ and $M_6$ are electrically connected, the drain of the NMOSFET $M_8$ is electrically connected to the source of the NMOSFET $M_7$, the source of the NMOSFET $M_8$ receiving the voltage $V_{SS}$; the second differential transistor pair circuit includes NMOSFETs $M_{2A}$ and $M_{2B}$; the gate of the NMOSFET $M_{2A}$ is electrically connected to the drain of the NMOSFET $M_{1B}$, the gate of the NMOSFET $M_{2B}$ is electrically connected to the drain of the NMOSFET $M_{1A}$; the drains of the NMOSFETs $M_{2A}$ and $M_{2B}$ are electrically connected to the matching circuit; the bandwidth boost circuit includes capacitors $C_{F1}$ and $C_{F2}$, one end of the capacitor $C_{F1}$ is electrically connected to the gate of the NMOSFET $M_{2A}$, the other end of the capacitor $C_{F1}$ is electrically connected to the drain of the NMOSFET $M_{2B}$; one end of the capacitor $C_{F2}$ is electrically connected to the gate of the NMOSFET $M_{2B}$, the other end of the capacitor $C_{F2}$ is electrically connected to the drain of the NMOSFET $M_{2A}$; the matching circuit includes resistors $R_1$ and $R_2$; one end of the resistor $R_1$ is electrically connected to the drain of the NMOSFET $M_{2A}$, the other end of the resistor $R_1$ is electrically connected to the ground; one end of the resistor $R_2$ is electrically connected to the drain of the NMOSFET $M_{2B}$, the other end of the resistor $R_2$ is electrically connected to the ground; the drain of the NMOSFET $M_{2A}$ of the first driving unit is electrically connected to the drain of the NMOSFET $M_{2A}$ of the second driving unit, and the drain of the NMOSFET $M_{2B}$ of the first driving unit is electrically connected to the drain of the NMOSFET $M_{2B}$ of the second driving unit, two connection ends are connected to the connection of the NMOSFET $M_{2A}$ of the first driving unit and the second driving unit and the connection of the NMOSFET $M_{2B}$ of the first driving unit and the second driving unit, respectively, the two connection ends serves as the outputs of the signal $V_0$; the second cascode current mirror circuit includes NMOSFETs $M_9$, $M_{10}$, $M_{11}$ and $M_{12}$; the gate and the drain of the NMOSFET $M_9$ are electrically connected, and receiving a current $I_{B2}$; the gate and the drain of the NMOSFET $M_{10}$ are electrically connected, and electrically connected to the source of the NMOSFET $M_9$; the source of the NMOSFET $M_{10}$ is receiving the voltage $V_{SS}$; the gates of the NMOSFETs $M_{11}$ and $M_9$ is electrically connected to electrically connected, the drain of the NMOSFET $M_{11}$ is electrically connected to the sources of the NMOSFETs $M_{2A}$ and $M_{2B}$; the gates of the NMOSFET $M_{12}$ and $M_{10}$ are electrically connected, the drain of the NMOSFET $M_{12}$ is electrically connected to the source of the NMOSFET $M_{11}$, the source of the NMOSFET $M_{12}$ receiving the voltage $V_{SS}$; the gates of the NMOSFETs $M_{1A}$ and $M_{1B}$ of the first driving unit are used for receiving the signals $V_{in1}$, the gates of the NMOSFETs $M_{1A}$ and $M_{1B}$ of the second driving unit are used for receiving the signals $V_{in2}$; the drain of the NMOSFET $M_{2A}$ of the first driving unit is electrically connected to the drain of the NMOSFET $M_{2A}$ of the second driving unit, and the drain of the NMOSFET $M_{2B}$ of the first driving unit is electrically connected to the drain of the NMOSFET $M_{2B}$ of the second driving unit, two connection ends are connected to the connection of the NMOSFET $M_{2A}$ of the first driving unit and the second driving unit and the connection of the NMOSFET $M_{2B}$ of the first driving unit and the second driving unit, respectively, the two connection ends serving as the outputs of the signal $V_0$.

The solution of the present invention, for solving the above problem, is to apply the laser driver with high-speed and high-current which receives high-speed differential data signals, and output differential drive voltage signal after processing the differential data signals by negative capacitance technique. The present invention avoids the enhancement of chip area caused by the use of passive inductors peaking mode to enhance bandwidth, and reduces the cost of chip. It does not need to use buffer level circuit to realize DC level transfer, which reduces design complexity and circuit power consumption in the present invention. Meanwhile, the negative capacitance technique is applied to optimize the circuit bandwidth, so as to ensure the working speed of the circuit, and the present invention uses two driving units with similar structure to realize a circuit that can be applied to NRZ modulated direct modulation laser, indirect modulation laser and four-level modulation transmitter.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

First Embodiment

Figure 1:
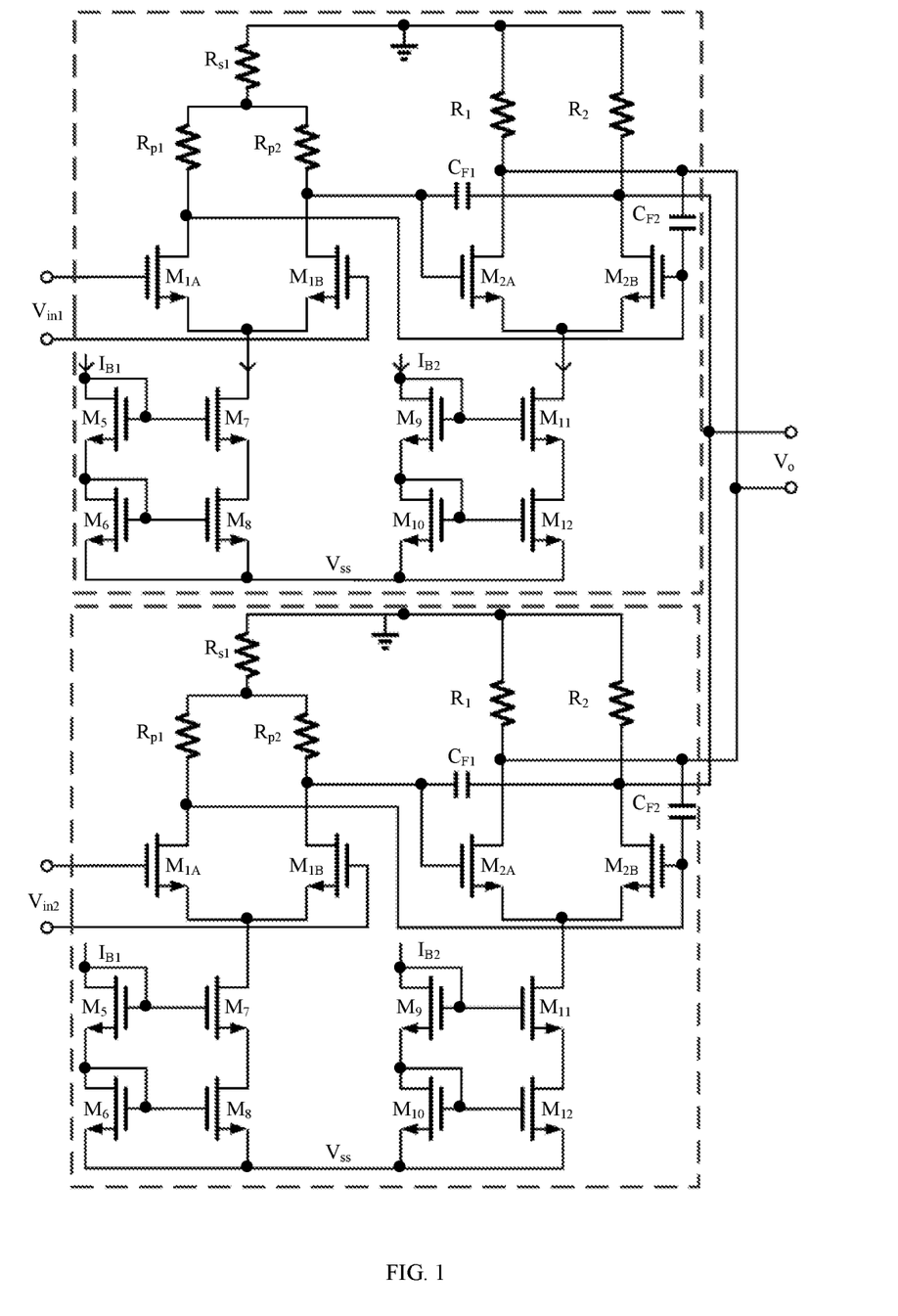
FIG. 1 is a circuit diagram of the laser driver with high-speed and high-current, according to the first embodiment of the present invention.

A laser driver with high-speed and high-current is shown as an embodiment. The laser driver is used for receiving a pair of high-speed differential data signals $V_{in1}$, $V_{in2}$, and outputting a differential drive voltage signal $V_0$. The laser driver includes a first driving unit (Slice I) and a second driving unit (Slice II), and each driving unit includes a pre-drive amplifier circuit and a main drive amplifier circuit.

Referring to FIG. 1, the pre-drive amplifier circuit includes six n-type metal-oxide-semiconductors (NMOSFETs $M_{1A}$, $M_{1B}$, $M_5 \sim M_8$) and three resistors (resistors $R_{p1}$, $R_{p2}$, $R_{s1}$).

One end of the resistor $R_{p1}$ is electrically connected to the drain of the NMOSFET $M_{1A}$, the other end of the resistor $R_{p1}$ is electrically connected to one end of the resistor $R_{s1}$. One end of the resistor $R_{p2}$ is electrically connected to the drain of the NMOSFET $M_{1B}$, the other end of the resistor $R_{p2}$ is electrically connected to one end of the resistor $R_{s1}$, the other end of the resistor $R_{s1}$ is electrically connected to ground.

The NMOSFETs $M_{1A}$ and $M_{1B}$ are differential input transistors, the gates of the NMOSFETs $M_{1A}$ and $M_{1B}$ of the first driving unit are used for receiving the signals $V_{in1}$, the gates of the NMOSFETs $M_{1A}$ and $M_{1B}$ of the second driving unit are used for receiving the signals $V_{in2}$. The gate and the drain of the NMOSFET $M_5$ are electrically connected, and is used for receiving a current $I_{B1}$. The gate and the drain of the NMOSFET $M_6$ are electrically connected, and connected to the source of the NMOSFET $M_5$ electrically. The source of the NMOSFET $M_6$ is used to receive a voltage $V_{SS}$. The gates of the NMOSFETs $M_7$ and $M_5$ are electrically connected, and the drain of the NMOSFET $M_7$ electrically is connected to the sources of the NMOSFETs $M_{1A}$ and $M_{1B}$. The gates of the NMOSFETs $M_8$ and $M_6$ are electrically connected, the drain of the NMOSFET $M_8$ is electrically connected to the source of the NMOSFET $M_7$, and the source of the NMOSFET $M_8$ is used for receiving the voltage $V_{SS}$.

The main function of the resistor $R_{s1}$ is to reduce the DC common mode level of the output of the pre-drive amplifier circuit, so that the differential input transistor of the main drive amplifier circuit can work in a saturated state. The NMOSFETs $M_8 \sim M_8$ form a cascode current mirror. The NMOSFETs $M_{1A}$ and $M_{1B}$ are a pair of differential transistors, they convert the data signals $V_{in1}$ and $V_{in2}$ into differential current, which is then converted into a differential voltage output through two resistors $R_{p1}$ and sent to the next stage.

The main drive amplifier circuit includes six n-type metal-oxide-semiconductors (NMOSFETs $M_{2A}$, $M_{2B}$, $M_9 \sim M_{12}$), two resistors (resistors $R_1$, $R_2$) and two capacitors (capacitors $C_{F1}$, $C_{F2}$). In this embodiment, the resistance values of the resistors $R_1$ and $R_2$ is equal to 100Ω, and the capacitance value of the capacitor $C_{F1}$ is equal to the capacitance value of the capacitor $C_{F2}$.

The gate of the NMOSFET $M_{2A}$ is electrically connected to the drain of the NMOSFET $M_{1B}$, the gate of the NMOSFET $M_{2B}$ is electrically connected to the drain of the NMOSFET $M_{1A}$. The drain of the NMOSFET $M_{2A}$ of the first driving unit is electrically connected to the drain of the NMOSFET $M_{2A}$ of the second driving unit, and the drain of the NMOSFET $M_{2B}$ of the first driving unit is electrically connected to the drain of the NMOSFET $M_{2B}$ of the second driving unit, two connection ends are connected to the connection of the NMOSFET $M_{2A}$ of the first driving unit and the second driving unit and the connection of the NMOSFET $M_{2B}$ of the first driving unit and the second driving unit, respectively, the two connection ends serves as the outputs of the signal $V_O$.

One end of the resistor $R_1$ is electrically connected to the drain of the NMOSFET $M_{2A}$, the other end of the resistor $R_1$ is electrically connected to ground. One end of the resistor $R_2$ is electrically connected to the drain of the NMOSFET $M_{2B}$, the other end of the resistor $R_2$ is electrically connected to the ground. One end of the capacitor $C_{F1}$ is electrically connected to the gate of the NMOSFET $M_{2A}$, the other end of the capacitor $C_{F1}$ is electrically connected to the drain of the NMOSFET $M_{2B}$. One end of the capacitor $C_{F2}$ is electrically connected to the gate of the NMOSFET $M_{2B}$, the other end of the capacitor $C_{F2}$ is electrically connected to the drain of the NMOSFET $M_{2A}$. The gate and the drain of the NMOSFET $M_9$ are electrically connected, and is used for receiving a current $I_{B2}$. The gate and the drain of the NMOSFET $M_{10}$ are electrically connected, and electrically connect the source of the NMOSFET $M_9$. The source of the NMOSFET $M_{10}$ is used for receiving the voltage $V_{SS}$. The gates of the NMOSFETs $M_{11}$ and $M_9$ are electrically connected, the drain of the NMOSFET $M_{11}$ is electrically connected to the sources of the NMOSFETs $M_{2A}$ and $M_{2B}$. The gates of the NMOSFETs $M_{12}$ and $M_{10}$ are electrically connected, the drain of the NMOSFET $M_{12}$ are electrically connected to the source of the NMOSFET $M_{11}$, the source of the NMOSFET $M_{12}$ is used for receiving the voltage $V_{SS}$.

In this embodiment, the function of the capacitor $C_{F1}$ is to improve the rising and falling speed of the output signal edge by using positive feedback, and reduce the large input capacitance caused by Miller effect and thus improve the bandwidth. The two resistors with a resistance value of 100Ω are able to effectively suppress the ringing caused by the binding line inductance and complete the impedance matching of the output. The NMOSFETs $M_{2A}$ and $M_{2B}$ further amplify the output signal of the main drive amplifier circuit. The NMOSFETs $M_9$~$M_{12}$ form a cascode current mirror to provide output modulation current.

In addition, it should be noted that although the structure and connection relationships of the Slice II and the Slice I are similar, but the size of the NMOSFET of the Slice II is smaller than the size of the NMOSFET of the Slice I. The Slice I and the Slice II modulate the current by controlling the sizes of two external reference current sources to make one external reference current source valid and the other external reference current source invalid or both the two external reference current sources valid.

When only one of the two external reference current sources is valid, namely, the current $I_{B1}$ or $I_{B2}$ is valid, the two connection ends are electrically connected with an external resistor, the signal $V_O$ is directly modulated by the typical input impedance of the laser. When the resistance value of the external resistor is equal to 25Ω, the Slice I is able to provide a maximum modulation current of 80 mA, the Slice II is able to provide a maximum modulation current of 40 mA. When the resistance value of the external resistor is equal to 50, the Slice I is able to provide a maximum modulation current of 60 mA, the Slice II is able to provide a maximum modulation current of 30 mA When both the currents $I_{B1}$ and $I_{B2}$ are valid, the two driving units modulate the signal $V_O$ directly by a four-level Pulse Amplitude Modulated mode (PAM4), the two driving units are able to provide a maximum modulation current of 120 mA.

As described above, the laser driver with high-speed and high-current receives high-speed differential data signals, and outputs differential drive voltage signal after processed the differential data signals by negative capacitance technique. This embodiment avoids the enhancement of chip area caused by the use of passive inductors peaking mode to enhance bandwidth, and reduces the cost of chip. It does not need to use buffer level circuit to realize DC level transfer, and reduces design complexity and circuit power consumption in this embodiment. Meanwhile, the negative capacitance technique is applied to optimize the circuit bandwidth, so as to ensure the working speed of the circuit, and this embodiment uses two driving units with similar structure to realize the circuit can be applied to NRZ modulated direct modulation laser, indirect modulation laser and four-level modulation transmitter.

Second Embodiment

Figure 2:
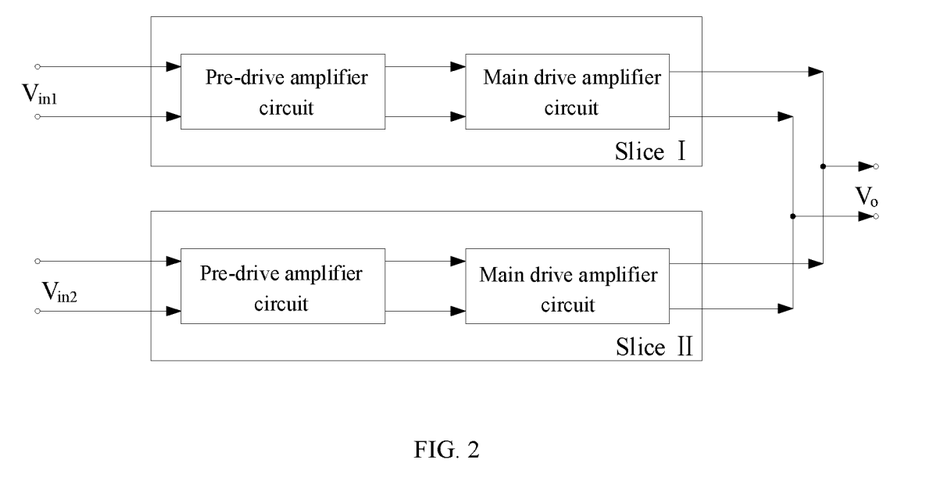
FIG. 2 is a module diagram of the laser driver with high-speed and high-current, according to the second embodiment of the present invention.

Referring to FIG. 2, a laser driver with high-speed and high-current is shown as an embodiment. The laser driver is used for receiving a pair of high-speed differential data signals $V_{in1}$, $V_{in2}$, and outputting a differential drive voltage signal $V_O$. The laser driver includes a first driving unit (Slice I) and a second driving unit (Slice II), and each driving unit includes a pre-drive amplifier circuit and a main drive amplifier circuit.

Figure 3:
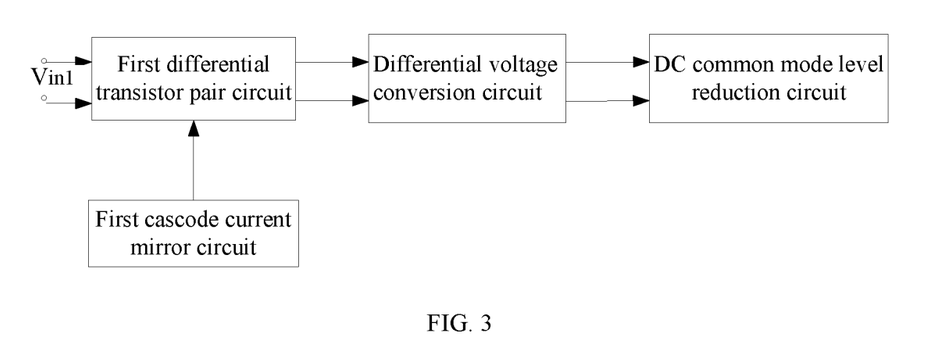
FIG. 3 is a module diagram of the pre-drive amplifier circuit of the laser driver, according to the second embodiment of the present invention.

Referring to FIG. 3, the pre-drive amplifier circuit includes a first differential transistor pair circuit, a differential voltage conversion circuit, a DC common mode level reduction circuit and a first cascode current mirror circuit.

Referring to FIG. 1 again, the first differential transistor pair circuit is used for converting one high-speed differential data signal into a first differential current signal. In this embodiment, the first differential transistor pair circuit can include the NMOSFETs $M_{1A}$ and $M_{1B}$ in the first embodiment.

The differential voltage conversion circuit is used for converting the first differential current signal into a first differential voltage signal. For example, the differential voltage conversion circuit can include the resistors $R_{p1}$ and $R_{p2}$ in the first embodiment.

The DC common mode level reduction circuit is used for reducing the DC common mode level of the first differential voltage signal, then transmitting the reduced differential voltage signal to the main drive amplifier circuit. In this embodiment, the DC common mode level reduction circuit can include the resistor $R_{s1}$ in the first embodiment.

The first cascode current mirror circuit is used for providing an output modulation current for the first differential transistor pair circuit. In this embodiment, the first cascode current mirror circuit can include the NMOSFETs $M_5$, $M_6$, $M_7$ and $M_8$ in the first embodiment.

Actually, one end of the resistor $R_{p1}$ is electrically connected to the drain of the NMOSFET $M_{1A}$, the other end of the resistor $R_{p1}$ is electrically connected to one end of the resistor $R_{s1}$. One end of the resistor $R_{p2}$ is electrically connected to the drain of the NMOSFET $M_{1B}$, the other end of the resistor $R_{p2}$ is electrically connected to one end of the resistor $R_{s1}$, the other end of the resistor $R_{s1}$ is electrically connected to ground. The NMOSFETs $M_{1A}$ and $M_{1B}$ are differential input transistors, the gates of the NMOSFETs $M_{1A}$ and $M_{1B}$ of the first driving unit are used for receiving the signals $V_{in1}$, the gates of the NMOSFETs $M_{1A}$ and $M_{1B}$ of the second driving unit are used for receiving the signals $V_{in2}$. The gate and the drain of the NMOSFET $M_5$ are electrically connected, and receiving a current Isi. The gate and the drain of the NMOSFET $M_6$ are electrically connected, and connected to the source of the NMOSFET $M_5$ electrically. The source of the NMOSFET $M_6$ is used to receive a voltage $V_{SS}$. The gates of the NMOSFETs $M_7$ and $M_5$ are electrically connected, and the drain of the NMOSFET $M_7$ is electrically connected to the sources of the NMOSFETs $M_{1A}$ and $M_{1B}$. The gates of the NMOSFETs $M_8$ and $M_6$ are electrically connected, the drain of the NMOSFET $M_8$ is electrically connected to the source of the NMOSFET $M_7$, and the source of the NMOSFET $M_8$ is used for receiving the voltage $V_{SS}$.

Figure 4:
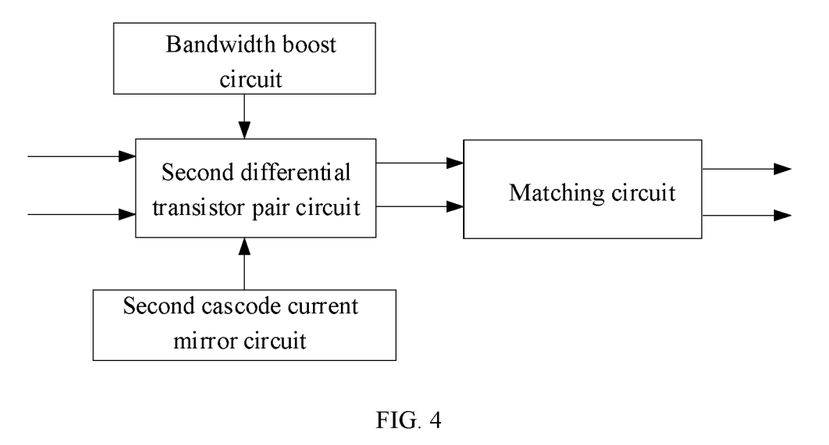
FIG. 4 is a module diagram of the main drive amplifier circuit of the laser driver, according to the second embodiment of the present invention.

Referring to FIG. 4, the main drive amplifier circuit includes a second differential transistor pair circuit, a bandwidth boost circuit, a matching circuit and a second cascode current mirror circuit.

The second differential transistor pair circuit is used for converting the first differential voltage signal into a second differential current signal. In this embodiment, the second differential transistor pair circuit can include the NMOSFETs $M_{2A}$ and $M_{2B}$ in the first embodiment.

The bandwidth boost circuit is used for improving the bandwidth of the second differential transistor pair circuit. In this embodiment, the bandwidth boost circuit can include the capacitors $C_{F1}$ and $C_{F2}$ in the first embodiment.

The matching circuit is used for binding the ringing caused by the line inductance and to complete the impedance matching of the laser driver. In this embodiment, the matching circuit can include the resistors $R_1$ and $R_2$ in the first embodiment.

The second cascode current mirror circuit is used for providing a modulation current for the second differential transistor pair circuit. In this embodiment, the second cascode current mirror circuit can include the NMOSFETs $M_9$, $M_{10}$, $M_{11}$ and $M_{12}$ in the first embodiment.

Actually, the gate of the NMOSFET $M_{2A}$ is electrically connected to the drain of the NMOSFET $M_{1B}$, the gate of the NMOSFET $M_{2B}$ is electrically connected to the drain of the NMOSFET $M_{1A}$. The drain of the NMOSFET $M_{2A}$ of the first driving unit is electrically connected to the drain of the NMOSFET $M_{2A}$ of the second driving unit, and the drain of the NMOSFET $M_{2B}$ of the first driving unit is electrically connected to the drain of the NMOSFET $M_{2B}$ of the second driving unit, two connection ends are connected to the connection of the NMOSFET $M_{2A}$ of the first driving unit and the second driving unit and the connection of the NMOSFET $M_{2B}$ of the first driving unit and the second driving unit, respectively, the two connection ends serves as the outputs of the signal $V_O$.

One end of the resistor $R_1$ is electrically connected to the drain of the NMOSFET $M_{2A}$, the other end of the resistor $R_1$ is electrically connected to the ground. One end of the resistor $R_2$ is electrically connected to the drain of the NMOSFET $M_{2B}$, the other end of the resistor $R_2$ is electrically connected to the ground. One end of the capacitor $C_{F1}$ is electrically connected to the gate of the NMOSFET $M_{2A}$, the other end of the capacitor $C_{F1}$ is electrically connected to the drain of the NMOSFET $M_{2B}$. One end of the capacitor $C_{F2}$ is electrically connected to the gate of the NMOSFET $M_{2B}$, the other end of the capacitor $C_{F2}$ is electrically connected to the drain of the NMOSFET $M_{2A}$. The gate and the drain of the NMOSFET $M_9$ are electrically connected, and are used for receiving a current $I_{B2}$. The gate and the drain of the NMOSFET $M_{10}$ are electrically connected, and electrically connected to the source of the NMOSFET $M_9$. The source of the NMOSFET $M_{10}$ is used for receiving the voltage $V_{SS}$. The gates of the NMOSFETs $M_{11}$ and $M_9$ are electrically connected, the drain of the NMOSFET $M_{11}$ is electrically connected to the sources of the NMOSFETs $M_{2A}$ and $M_{2B}$. The gates of the NMOSFETs $M_{12}$ and $M_{10}$ are electrically connected, the drain of the NMOSFET $M_{12}$ are electrically connected to the source of the NMOSFET $M_{11}$, the source of the NMOSFET $M_{12}$ is used for receiving the voltage $V_{SS}$.

As described in the first embodiment, the Slice I and the Slice II directly coupled reduce the common mode output level of the former amplifier and ensure that the input transistor of the lower circuit works in the saturation region the two resistors $R_{s1}$ in series. The two capacitors CH are cross-coupled between the input and the output of the laser driver, which can expand the bandwidth and reduce the rising and falling time of the output pulse.

When only one of the two external reference current sources is valid, namely, the current $I_{B1}$ or $I_{B2}$ is valid, the two connection ends are electrically connected with an external resistor, the signal $V_O$ is directly modulated by the typical input impedance of the laser. When the resistance value of the external resistor is equal to 25Ω, the Slice I is able to provide a maximum modulation current of 80 mA, the Slice II is able to provide a maximum modulation current of 40 mA. When the resistance value of the external resistor is equal to 50Ω, the Slice I is able to provide a maximum modulation current of 60 mA, the Slice II is able to provide a maximum modulation current of 30 mA. When both the currents $I_{B1}$ and $I_{B2}$ are valid, the two driving units modulate the signal $V_O$ directly by a four-level Pulse Amplitude Modulated mode (PAM4), the two driving units are able to provide a maximum modulation current of 120 mA.

Third Embodiment

A current modulation method about a laser driver with high-speed and high-current is shown as an embodiment. The laser driver with high-speed and high-current can be the laser driver in the first embodiment. The current modulation method includes the following steps:

(1) judging whether the currents $I_{B1}$ and $I_{B2}$ are valid.

(2) when the current $I_{B1}$ and $I_{B2}$ are valid, electrically connecting the two connection ends with an external resistor, and modulating the signal $V_O$ directly by the typical input impedance of the laser. When only one of the two external reference current sources is valid, namely, the current $I_{B1}$ or $I_{B2}$ is valid, the two connection ends are electrically connected with an external resistor, the signal $V_O$ is directly modulated by the typical input impedance of the laser. When the resistance value of the external resistor is equal to 25Ω, the Slice I is able to provide a maximum modulation current of 80 mA, the Slice II is able to provide a maximum modulation current of 40 mA. When the resistance value of the external resistor is equal to 50Ω, the Slice I is able to provide a maximum modulation current of 60 mA, the Slice II is able to provide a maximum modulation current of 30 mA.

(3) when both the currents $I_{B1}$ and $I_{B2}$ are valid, modulating the signal $V_O$ directly by a four-level Pulse Amplitude Modulated mode. When both the currents $I_{B1}$ and $I_{B2}$ are valid, the two driving units modulate the signal $V_O$ directly by a four-level Pulse Amplitude Modulated mode (PAM4), the two driving units are able to provide a maximum modulation current of 120 mA.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A laser driver with high-speed and high-current, receiving a pair of high speed differential data signals $V_{in1}$, $V_{in2}$, and outputting a differential drive voltage signal $V_O$; the laser driver comprising a first driving unit and a second driving unit; each driving unit comprising a pre-drive amplifier circuit and a main drive amplifier circuit;

the pre-drive amplifier circuit comprising:
a NMOSFET $M_{1A}$;
a NMOSFET $M_{1B}$;
a resistor $R_{p1}$, one end of the resistor $R_{p1}$ electrically connecting the drain of the NMOSFET $M_{1A}$;
a resistor $R_{p2}$, one end of the resistor $R_{p2}$ electrically connecting the drain of the NMOSFET $M_{1B}$;
a resistor $R_{s1}$, one end of the resistor $R_{s1}$ electrically connecting the other ends of the resistors $R_{p1}$ and $R_{p2}$, the other end of the resistor $R_{s1}$ electrically connecting ground;
a NMOSFET $M_5$, the gate and the drain of the NMOSFET $M_5$ being electrically connected, and receiving a current $I_{B1}$;
a NMOSFET $M_6$, the gate and the drain of the NMOSFET $M_6$ being electrically connected, and electrically connecting the source of the NMOSFET $M_5$; the source of the NMOSFET $M_6$ receiving a voltage $V_{SS}$;
a NMOSFET $M_7$, the gates of the NMOSFETs $M_7$ and $M_5$ being electrically connected, the drain of the NMOSFET $M_7$ electrically connecting the sources of the NMOSFETs $M_{1A}$ and $M_{1B}$; and
a NMOSFET $M_8$, the gates of the NMOSFETs $M_8$ and $M_6$ being electrically connected, the drain of the NMOSFET $M_8$ electrically connecting the source of the NMOSFET $M_7$, the source of the NMOSFET $M_8$ receiving the voltage $V_{SS}$;

the main drive amplifier circuit comprising:
a NMOSFET $M_{2A}$, the gate of the NMOSFET $M_{2A}$ electrically connecting the drain of the NMOSFET $M_{1B}$;
a NMOSFET $M_{2B}$, the gate of the NMOSFET $M_{2B}$ electrically connecting the drain of the NMOSFET $M_{1A}$;
a resistor $R_1$, one end of the resistor $R_1$ electrically connecting the drain of the NMOSFET $M_{2A}$, the other end of the resistor $R_1$ electrically connecting ground;
a resistor $R_2$, one end of the resistor $R_2$ electrically connecting the drain of the NMOSFET $M_{2B}$, the other end of the resistor $R_2$ electrically connecting ground;
a capacitor $C_{F1}$, one end of the capacitor $C_{F1}$ electrically connecting the gate of the NMOSFET $M_{2A}$, the other end of the capacitor $C_{F1}$ electrically connecting the drain of the NMOSFET $M_{2B}$;
a capacitor $C_{F2}$, one end of the capacitor $C_{F2}$ electrically connecting the gate of the NMOSFET $M_{2B}$, the other end of the capacitor $C_{F2}$ electrically connecting the drain of the NMOSFET $M_{2A}$;

a NMOSFET $M_9$, the gate and the drain of the NMOSFET $M_9$ being electrically connected, and receiving a current $I_{B2}$;
a NMOSFET $M_{10}$, the gate and the drain of the NMOSFET $M_{10}$ being electrically connected, and electrically connecting the source of the NMOSFET $M_9$; the source of the NMOSFET $M_{10}$ receiving the voltage $V_{SS}$;
a NMOSFET $M_{11}$, the gates of the NMOSFETs $M_{11}$ and $M_9$ being electrically connected, the drain of the NMOSFET $M_{11}$ electrically connecting the sources of the NMOSFETs $M_{2A}$ and $M_{2B}$; and
a NMOSFET $M_{12}$, the gates of the NMOSFETs $M_{12}$ and $M_{10}$ being electrically connected, the drain of the NMOSFET $M_{12}$ electrically connecting the source of the NMOSFET $M_{11}$, the source of the NMOSFET $M_{12}$ receiving the voltage $V_{SS}$;

wherein the gates of the NMOSFETs $M_{1A}$ and $M_{1B}$ of the first driving unit being used for receiving the signals $V_{in1}$, the gates of the NMOSFETs $M_{1A}$ and $M_{1B}$ of the second driving unit being used for receiving the signals $V_{in2}$; the drain of the NMOSFET $M_{2A}$ of the first driving unit electrically connecting the drain of the NMOSFET $M_{2A}$ of the second driving unit, and the drain of the NMOSFET $M_{2B}$ of the first driving unit electrically connecting the drain of the NMOSFET $M_{2B}$ of the second driving unit, two connection ends are connected to the connection of the NMOSFET $M_{2A}$ of the first driving unit and the second driving unit and the connection of the NMOSFET $M_{2B}$ of the first driving unit and the second driving unit, respectively, the two connection ends serving as the outputs of the signal $V_O$.

2. The laser driver according to claim 1, wherein the resistance values of the resistors $R_1$ and $R_2$ being equal to 100Ω.

3. The laser driver according to claim 1, wherein the capacitance value of the capacitor $C_{F1}$ being equal to the capacitance value of the capacitor $C_{F2}$.

4. A laser driver with high-speed and high-current, receiving a pair of high-speed differential data signals $V_{in1}$, $V_{in2}$, and outputting a differential drive voltage signal $V_O$; the laser driver comprising a first driving unit and a second driving unit; each driving unit comprising a pre-drive amplifier circuit and a main drive amplifier circuit;

the pre-drive amplifier circuit comprising:
a first differential transistor pair circuit, being used for converting one high-speed differential data signal into a first differential current signal;
a differential voltage conversion circuit, being used for converting the first differential current signal into a first differential voltage signal;
a DC common mode level reduction circuit, being used for reducing the DC common mode level of the first differential voltage signal, then transmitting the reduced differential voltage signal to the main drive amplifier circuit; and
a first cascode current mirror circuit, being used for providing an output modulation current for the first differential transistor pair circuit;

the main drive amplifier circuit comprising:
a second differential transistor pair circuit, being used for converting the first differential voltage signal into a second differential current signal;
a bandwidth boost circuit, being used for improving the bandwidth of the second differential transistor pair circuit;

a matching circuit, being used for binding the ringing caused by the line inductance and to complete the impedance matching of the laser driver; and a second cascode current mirror circuit, being used for providing a modulation current for the second differential transistor pair circuit.

5. The laser driver according to claim 4, wherein the first differential transistor pair circuit comprising NMOSFETs $M_{1A}$ and $M_{1B}$; the gates of the NMOSFETs $M_{1A}$ and $M_{1B}$ of the first driving unit being used for receiving the signals $V_{in1}$, the gates of the NMOSFETs $M_{1A}$ and $M_{1B}$ of the second driving unit being used for receiving the signals $V_{in2}$; the drains of the NMOSFETs $M_{1A}$ and $M_{1B}$ electrically connecting the differential voltage conversion circuit.

6. The laser driver according to claim 5, wherein the differential voltage conversion circuit comprising resistors $R_{p1}$ and $R_{p2}$, the DC common mode level reduction circuit comprising a resistor $R_{s1}$; one end of the resistor $R_{p1}$ electrically connecting the drain of the NMOSFET $M_{1A}$, one end of the resistor $R_{p2}$ electrically connecting the drain of the NMOSFET $M_{1B}$; one end of the resistor $R_{s1}$ electrically connecting the other ends of the resistors $R_{p1}$ and $R_{p2}$, the other end of the resistor $R_{s1}$ electrically connecting ground.

7. The laser driver according to claim 5, wherein the first cascode current mirror circuit comprising NMOSFETs $M_5$, $M_6$, $M_7$ and $M_8$; the gate and the drain of the NMOSFET $M_5$ being electrically connected, and receiving a current $I_{B1}$; the gate and the drain of the NMOSFET $M_6$ being electrically connected, and electrically connecting the source of the NMOSFET $M_5$; the source of the NMOSFET $M_6$ receiving a voltage $V_{SS}$; the gates of the NMOSFETs $M_7$ and $M_5$ being electrically connected, the drain of the NMOSFET $M_7$ electrically connecting the sources of the NMOSFETs $M_{1A}$ and $M_{1B}$; the gates of the NMOSFETs $M_8$ and $M_6$ being electrically connected, the drain of the NMOSFET $M_8$ electrically connecting the source of the NMOSFET $M_7$, the source of the NMOSFET $M_8$ receiving the voltage $V_{SS}$.

8. The laser driver according to claim 5, wherein the second differential transistor pair circuit comprising NMOSFETs $M_{2A}$ and $M_{2B}$; the gate of the NMOSFET $M_{2A}$ electrically connecting the drain of the NMOSFET $M_{1B}$, the gate of the NMOSFET $M_{2B}$ electrically connecting the drain of the NMOSFET $M_{1A}$; the drains of the NMOSFETs $M_{2A}$ and $M_{2B}$ electrically connecting the matching circuit.

9. The laser driver according to claim 8, wherein the bandwidth boost circuit comprising capacitors $C_{F1}$ and $C_{F2}$; one end of the capacitor $C_{F1}$ electrically connecting the gate of the NMOSFET $M_{2A}$, the other end of the capacitor $C_{F1}$ electrically connecting the drain of the NMOSFET $M_{2B}$; one end of the capacitor $C_{F2}$ electrically connecting the gate of the NMOSFET $M_{2B}$, the other end of the capacitor $C_{F2}$ electrically connecting the drain of the NMOSFET $M_{2A}$.

10. The laser driver according to claim 8, wherein the matching circuit comprising resistors $R_1$ and $R_2$; one end of the resistor $R_1$ electrically connecting the drain of the NMOSFET $M_{2A}$, the other end of the resistor $R_1$ electrically connecting ground; one end of the resistor $R_2$ electrically connecting the drain of the NMOSFET $M_{2B}$, the other end of the resistor $R_2$ electrically connecting ground.

11. The laser driver according to claim 8, wherein the drain of the NMOSFET $M_{2A}$ of the first driving unit electrically connecting the drain of the NMOSFET $M_{2A}$ of the second driving unit, and the drain of the NMOSFET $M_{2B}$ of the first driving unit electrically connecting the drain of the NMOSFET $M_{2B}$ of the second driving unit, two connection ends are connected to the connection of the NMOSFET $M_{2A}$ of the first driving unit and the second driving unit and the connection of the NMOSFET $M_{2B}$ of the first driving unit and the second driving unit, respectively, the two connection ends serving as the outputs of the signal $V_O$.

12. The laser driver according to claim 8, wherein the second cascode current mirror circuit comprising NMOSFETs $M_9$, $M_{10}$, $M_{11}$ and $M_{12}$; the gate and the drain of the NMOSFET $M_9$ being electrically connected, and receiving a current $I_{B2}$; the gate and the drain of the NMOSFET $M_{10}$ being electrically connected, and electrically connecting the source of the NMOSFET $M_9$; the source of the NMOSFET $M_{10}$ receiving the voltage $V_{SS}$; the gates of the NMOSFETs $M_{11}$ and $M_9$ being electrically connected, the drain of the NMOSFET $M_{11}$ electrically connecting the sources of the NMOSFETs $M_{2A}$ and $M_{2B}$; the gates of the NMOSFETs $M_{12}$ and $M_{10}$ being electrically connected, the drain of the NMOSFET $M_{12}$ electrically connecting the source of the NMOSFET $M_{11}$, the source of the NMOSFET $M_{12}$ receiving the voltage $V_{SS}$.

* * * * *